United States Patent
Takahashi

Patent Number: 5,831,715
Date of Patent: Nov. 3, 1998

[54] PROJECTION EXPOSURE APPARATUS WITH MEANS TO VARY SPHERICAL ABERRATION

[75] Inventor: Kazuhiro Takahashi, Utsunomiya, Japan

[73] Assignee: Canon Kabushiki Kaisha, Tokyo, Japan

[21] Appl. No.: 869,169

[22] Filed: Jun. 4, 1997

Related U.S. Application Data

[63] Continuation of Ser. No. 377,350, Jan. 24, 1995, abandoned.

[30] Foreign Application Priority Data

Jan. 27, 1994 [JP] Japan .................................. 6-007615

[51] Int. Cl.⁶ ............................. G03B 27/42; G03B 27/68
[52] U.S. Cl. ................................................. 355/53; 355/52
[58] Field of Search ........................................ 355/52, 53

[56] References Cited

U.S. PATENT DOCUMENTS

| | | | |
|---|---|---|---|
| 4,634,240 | 1/1987 | Suzuki et al. | 350/508 |
| 4,688,932 | 8/1987 | Suzuki | 355/51 |
| 4,711,568 | 12/1987 | Torigoe et al. | 355/68 |
| 4,739,373 | 4/1988 | Nishi et al. | 355/53 |
| 4,801,977 | 1/1989 | Ishizaka et al. | 355/30 |
| 4,853,756 | 8/1989 | Matsuki | 355/71 |
| 4,875,076 | 10/1989 | Torigoe et al. | 355/53 |
| 4,888,614 | 12/1989 | Suzuki et al. | 355/43 |
| 4,894,611 | 1/1990 | Shimoda et al. | 324/158 R |
| 4,905,041 | 2/1990 | Aketagawa | 355/53 |
| 4,908,656 | 3/1990 | Suwa et al. | 355/53 |
| 4,965,630 | 10/1990 | Kato et al. | 355/52 |
| 4,974,736 | 12/1990 | Okunuki et al. | 219/121.12 |
| 4,988,188 | 1/1991 | Ohta | 353/122 |
| 5,117,254 | 5/1992 | Kawashima et al. | 355/43 |
| 5,286,963 | 2/1994 | Torigoe | 250/201.2 |
| 5,305,054 | 4/1994 | Suzuki et al. | 355/53 |
| 5,311,362 | 5/1994 | Matsumoto et al. | 359/738 |
| 5,424,552 | 6/1995 | Tsuji et al. | 250/548 |
| 5,448,336 | 9/1995 | Shiraishi | 355/71 |

FOREIGN PATENT DOCUMENTS

| | | |
|---|---|---|
| 60-214335 | 10/1985 | Japan . |
| 2-166719 | 6/1990 | Japan . |

OTHER PUBLICATIONS

Matsumoto, et al., "Issues and Method of Designing Lenses for Optical Lithography," Optical Engineering, vol. 13, No. 12, Dec. 1992, pp. 2657 through 2665.

Primary Examiner—R. L. Moses
Assistant Examiner—Shival Virmani
Attorney, Agent, or Firm—Fitzpatrick, Cella, Harper & Scinto

[57] ABSTRACT

A projection exposure apparatus includes a projection optical system for projecting a pattern of a first object onto a second object; an illuminator for illuminating the pattern of the first object, a wavelength changing device for changing a wavelength of the light from the illuminator; a spherical aberration selector for selecting a spherical aberration of the projection optical system; and a wavelength controller for controlling the wavelength by the wavelength changing device in accordance with the spherical aberration set by the selector.

15 Claims, 5 Drawing Sheets

PROJECTION EXPOSURE APPARATUS WITH MEANS TO VARY SPHERICAL ABERRATION

This application is a continuation of application Ser. No. 08/377,350, filed Jan. 24, 1995, now abandoned.

FIELD OF THE INVENTION AND RELATED ART

The present invention relates to a projection exposure apparatus usable for manufacturing devices such as a semiconductor device such as IC or LSI, an image pick-up device such as a CCD, a display device such as a liquid crystal panel, a magnetic head or the like, and a device manufacturing method for manufacturing the devices.

Recently, the density of the semiconductor device such as IC or LSI is acceleratedly increased, and the resultant development for the fine processing for a semiconductor wafer is also remarkable. The projection exposure technique, which is the key part of the fine processing, is under development for an increase of the resolution to form an image of a dimension not more than 0.5 $\mu$m. The increase of the resolution in the projection exposure optical system, is directed to increase of the NA (numerical aperture) or decrease the wavelength of the exposure beam.

Figure 2:
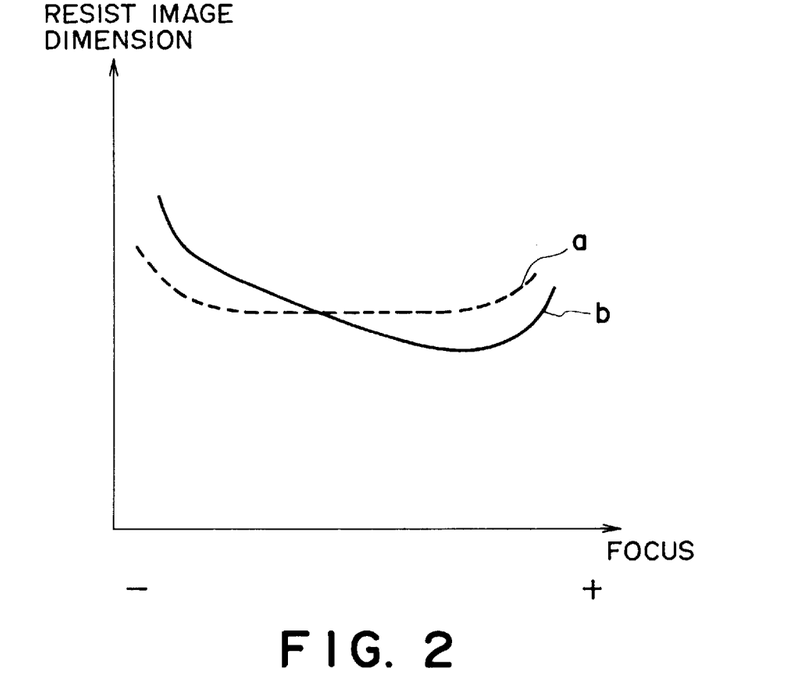
FIG. 2 shows a relationship between the spherical aberration and the line width change relative to the degree of defocusing.

However, with the increase of the NA of the projection optical system and decrease of the exposure wavelength, the depth of focus decreases with the result that the size of the image (resist image) in the resist changes depending on the position of the wafer in the direction of the optical axis as shown in FIG. 2 by the defocusing of the device pattern in the resist even under the ideal conditions completely without aberration.

This is described in detail in OPTICAL ENGINEERING (December 1992) vol. 31, No. 12, pages 2657–2664. According to this, the size change of the resist image relative to the defocusing can be reduced by providing a predetermined degree of spherical aberration.

However, the relationship between the degree of defocusing and the size of the resist image changes with the material of the resist used. The degree of the spherical aberration for minimizing the size change has even different polarity (positive or negative) if the types of the resist are different (positive or negative). Therefore, in order to suppress the size change for various resist materials, the spherical aberration is required to be adjusted in accordance with the resist material to be used.

As a method of adjusting the spherical aberration, a plane-parallel plate disposed adjacent to the image plane of the projection optical system is replaced with another plate having a different thickness.

Generally speaking, the projection optical system used in the photolithographic process is required to have very high assembling accuracy, and therefore, when the plane-parallel plate is exchanged, the inclination and eccentricity has to be adjusted with very high precision, with the result of a time consuming operation.

Accordingly, a method or apparatus with which the spherical aberration can be easily adjusted is needed.

SUMMARY OF THE INVENTION

Accordingly, it is a principal object of the present invention to provide a projection exposure method and apparatus and a device manufacturing method using the same, wherein the spherical aberration can be set to a desired level in an easier manner.

According to an aspect of the present invention, there is provided a projection exposure method comprising the steps of: projecting a pattern of a first object onto a second object through a projection optical system; changing a spherical aberration of the projection optical system by changing a wavelength of light which illuminates the first object; correcting a change of optical performance other than the spherical aberration resulting from the change of the wavelength.

According to this aspect, the spherical aberration is relatively easily adjusted by changing the wavelength.

According to another aspect of the present invention, there is provided a projection exposure apparatus comprising: a projection optical system for projecting a pattern of a first object onto a second object; illuminating means for illuminating the pattern of the first object, wavelength changing means for changing a wavelength of the light from the illuminating means; spherical aberration setting means for setting a spherical aberration of the projection optical system; and wavelength control means for controlling the wavelength by the wavelength changing means in accordance with the spherical aberration set by the setting means.

According to this aspect of the present invention, the spherical aberration of the projection optical system can be relatively easily adjusted.

According to a further embodiment of the present invention, the light source of the illumination means is in the form of a narrow band laser provided with wavelength changing means for changing an oscillation wavelength. By this, in addition to the change of the spherical aberration, the resolution is increased by decreasing the chromatic aberration of the projection optical system since the wavelength bandwidth is narrow.

According to a further improvement, the optical performance other than the spherical aberration of the projection optical system resulting from the change of the wavelength, is corrected to prevent the deterioration of the imaging performance of the projection exposure apparatus. According to a further improvement, the change of the focus position of the projection optical system resulting from the change of the wavelength is corrected so that the defocusing of the image of the first object on the second object is prevented. According to a further improvement, the change of the magnification of the projection optical system resulting from the wavelength change is corrected to prevent misalignment between the pattern of the first object and the pattern on the second object.

According to a yet further improvement, the focus position and the magnification changes of the projection optical system resulting from the change of the wavelength are corrected so that the defocusing is prevented and the misalignment is also prevented.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
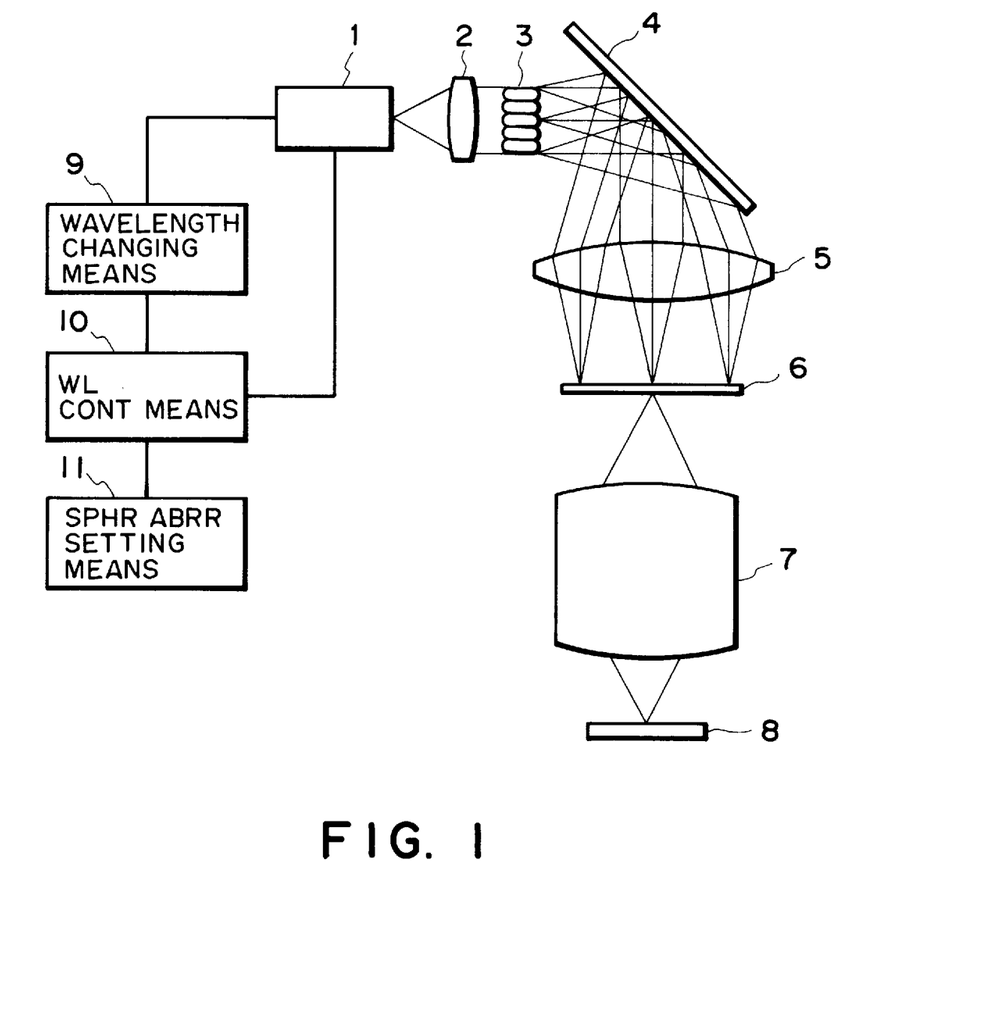
FIG. 1 illustrates a system according to a first embodiment of the present invention.

Referring to FIG. 1, there is shown a system according to a first embodiment of the present invention, which is a projection exposure apparatus usable for manufacturing various devices such as a semiconductor device such as IC or LSI, an image pick-up device such as a CCD, a display device such as a liquid crystal panel, a magnetic head or the like.

In FIG. 1, the illumination light from the light source 1 is condensed within a predetermined range at the incident plane of the fly-eye lens 3 by a positive power lens 2. The fly-eye lens 3 is constituted by a plurality of lenses, and a number of light rays from a secondary light source at the light emitting surface of the fly eye lens 3 is folded by 90 degrees toward the bottom by a folding mirror 4, and is overlaid on the reticle 4 (the surface to be illuminated) by a condenser lens 5. By this, the reticle is illuminated with a uniform illumination intensity.

The device pattern on the reticle 6 thus illuminated is projected on the wafer 8 through the projection optical system 7, and an image of the device pattern is formed on the wafer 8 so that the pattern is transferred onto the resist of the wafer 8. The projection optical system 7 may be constituted by refraction elements (lenses) or a combination of a refraction system and a reflection system (mirror).

The wavelength changing means 9 is effective to change the wavelength of the light from the light source 1. In this embodiment, a spherical aberration setting means 11 is used to permit automatic or manual input of the spherical aberration predetermined in accordance with a combination of the material of the photoresist on the wafer 8, a parameter (relating to the spherical aberration) of the projection optical system 7, and a line width of the pattern on the reticle 6 projected by the projection optical system 7.

FIG. 2 is a graph showing a relationship between a line width of the resist image and the focus position provided as a result of projecting the reticle 6 pattern onto the wafer 8 with a certain spherical aberration and developing the wafer 8, in which the ordinate represents a size of the resist image, and the abscissa represents a focus position with which the wafer 8 is exposed. The defocusing in the positive direction means a direction of the wafer 8 away from the projection optical system 7.

The solid line in FIG. 2 represents the line width change when the spherical aberration is 0, and the broken line represents the line width change when a predetermined degree of the spherical aberration a is produced. When the projection exposure of the reticle pattern is carried out using the resist having such a property, the change of the line width relative to the degree of the defocus can be minimized by setting the spherical aberration of the projection optical system 7 to a.

In FIG. 1, when the relationship between the spherical aberration and the line width change is as shown in FIG. 2, the spherical aberration a is inputted by the spherical aberration setting means 11.

The signal from the spherical aberration setting means 11 is supplied to the wavelength control means 10, in which the relationship between the spherical aberration (degree) and the wavelength is stored beforehand. It detects or calculates the output wavelength of the light source 1 in accordance with the signal from the spherical aberration setting means 11.

The wavelength changing means 9 adjust the wavelength selector (not shown) to provide the wavelength calculated by the wavelength control means 10. The wavelength control means 10 monitors the wavelength of a part of the light ray emitted by the light source 9 so as to provide the wavelength calculated by the wavelength setting means 10 by adjusting the output of the wavelength changing means 9.

Figure 3:
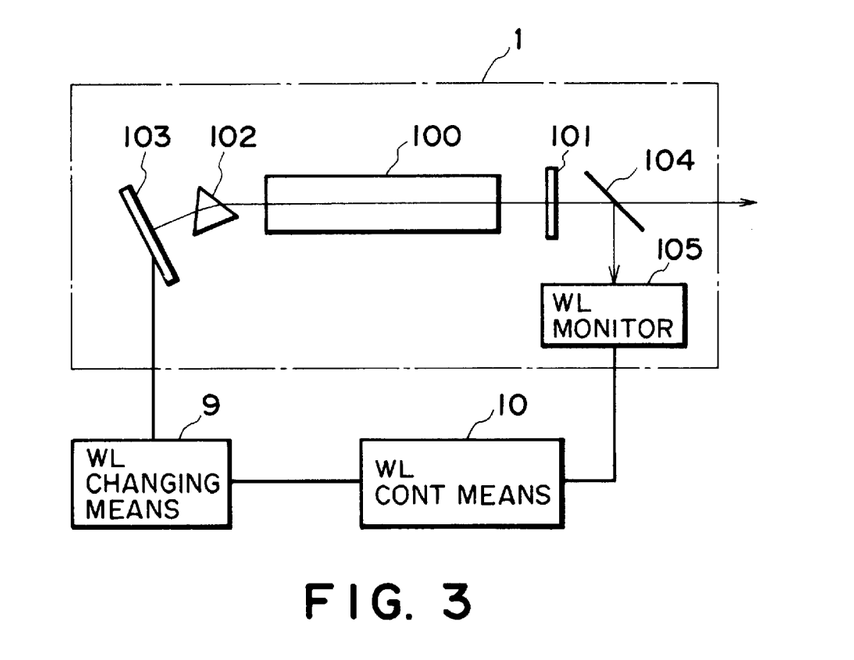
FIG. 3 illustrates a wavelength changing device when a narrow band laser is used as the light source in the first embodiment.

FIG. 3 shows an embodiment of a light source 1 and a wavelength changing means 9.

In FIG. 3, the light source 1 is in the form of a laser source for emitting a laser beam having a narrowed band width. The laser tube 100 contains a gas for laser oscillation and an electrode. An output mirror 101 has a predetermined transmissivity, and is effective to output a laser beam, and constitutes a part of an oscillator. An optical element for band-narrowing and for wavelength selection of the spectrum of the laser beam is constituted by a prism 102 and a diffraction grating 103. The central wavelength of the laser is controlled by changing an angle of the diffraction grating 103. The wavelength changing means 9 has a mechanism for driving the diffraction grating 103 to adjust the angle of the diffraction grating 103 in accordance with the signal from the wavelength control means 10, thus changing the central wavelength.

The laser beam transmitted through the output mirror 101 is partly folded by 90 degrees by a half mirror 104 to be incident on a wavelength monitor 105. The wavelength monitor 105 is provided with a spectroscope in the form of an etalon or the like to detect the central wavelength of the laser. The signal indicative of the central wavelength from the wavelength monitor 105 is fed to the wavelength control means 10, which supplies instructions to the wavelength control means to provide the set central wavelength.

In this embodiment, by changing the wavelength of the illumination light upon projection of the pattern of the reticle 6 onto the wafer through the projection optical system 11, the spherical aberration of the projection optical system is changed to a desired state. Since the spherical aberration is changed by changing the wavelength, the desired spherical aberration can be relatively easily set.

The projection exposure apparatus of this embodiment comprises the wavelength changing means 9 for changing the wavelength of the light for illuminating the pattern of the reticle 6, the spherical aberration setting means 11 for setting the degree of the spherical aberration of the projection optical system, and wavelength control means 10 for controlling the wavelength of the light from the illumination means by the wavelength changing means 9 in accordance with the spherical aberration set by the spherical aberration setting means 11. Therefore, the spherical aberration of the projection optical system can be set without difficulty.

Since the projection exposure apparatus uses a narrow band laser having a wavelength changing means 9 capable of changing the oscillation wavelength, as the light source, the laser beam having a narrowed band width can be used so that the chromatic aberration of the projection optical system 7 containing refraction optical elements, can be reduced, thus permitting an increase of the resolution of the apparatus. As an example of the narrow band laser, there is known an excimer laser.

Figure 4:
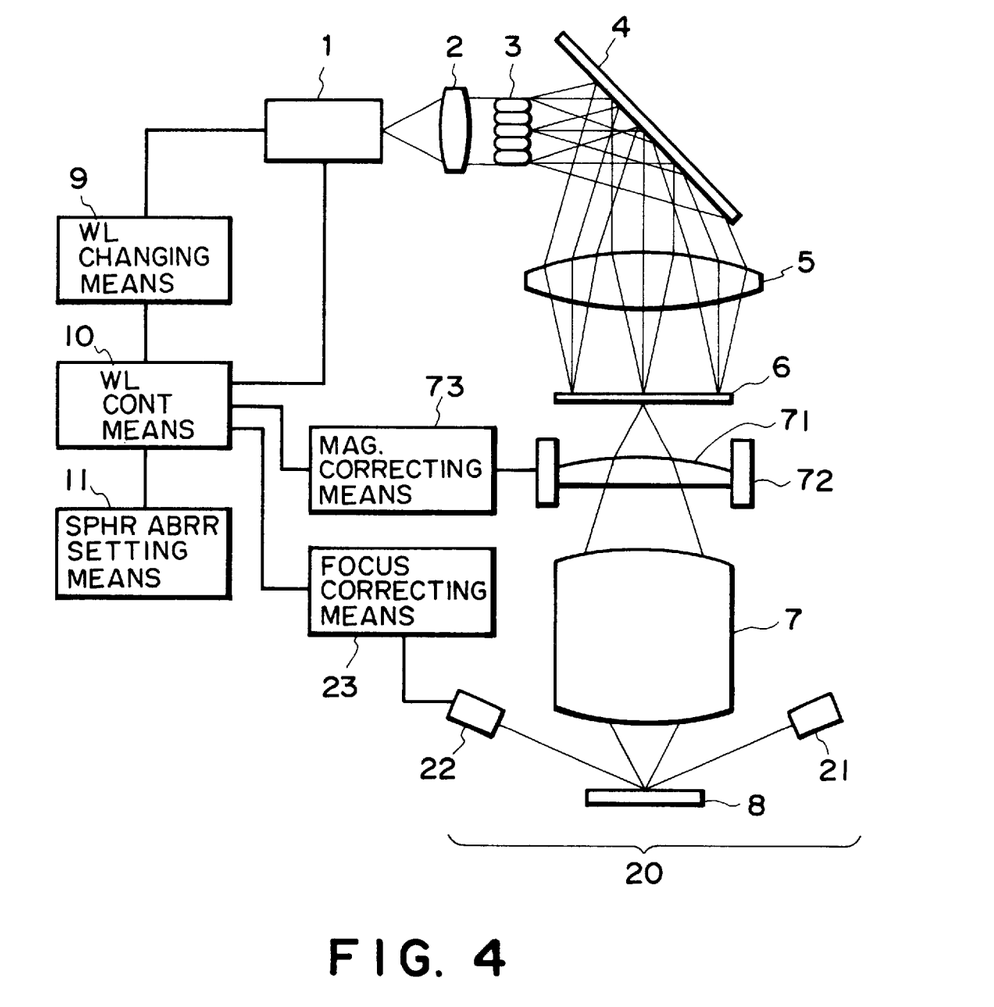
FIG. 4 illustrates a system according to a second embodiment of the present invention.

FIG. 4 shows a system according to a second embodiment of the present invention. The fundamental structure of this embodiment is similar to that of the first embodiment shown in FIG. 1. However, in the second embodiment, there is provided means for correcting optical performance of the projection optical system 7 other than the spherical aberration, resulting from the change of the wavelength of the light from the light source. The projection optical apparatus of this embodiment is usable for manufacturing various devices such as a semiconductor device such as IC or LSI, an image pickup device such as a CCD, a display device such as a liquid crystal panel, a magnetic head or the like.

In FIG. 4, the structure from the light source 1 to the wafer 8, inclusive, are the same as in the first embodiment (FIG. 1). The wavelength changing means 9 and the spherical aberration setting means 11 are also the same as in the first embodiment. However, the wavelength control means 10 feeds a signal indicative of the wavelength to the wavelength changing means 9 after the output wavelength of the light source 1 is detected. In addition, it also calculates the change of the optical performance of the projection optical system resulting from the change of the wavelength of the light from the light source 1.

The position, in the optical axis direction, of the wafer 8 (surface position and height), is detected by the focus position detecting means 20. The focus position detecting means 20 comprises a light emitting portion 21 for illuminating a predetermined area on the wafer 8 by a spot or sheet-like detecting means, and a detector 22 for receiving the light from the emitting portion 21 and reflected by the wafer 8 to detect the position, in the detection of the optical axis, of the wafer 8 on the basis of the position on the detector of the received light.

The change of the best focus position due to the wavelength change calculated by the wavelength control means 10 is fed to the focus position correcting means 23 as an offset. The detector 22 is normally adjusted such that the reflection light from the wafer 8 is focused at the center of the detector when the spherical aberration is 0. However, when the wavelength of the light source 1 is changed to produce a predetermined degree of the spherical aberration, the above offset is taken into account, and the Z stage 24 for the wafer 8 is actuated to move the wafer 8 in the direction of the optical axis toward the best focus position of the projection optical system 7.

The focus position correcting means 23 is not limited to that described above. Another example may change the focal length of the projection optical system. The focus position detecting means 20 may be an air pressure measuring type, an electrostatic capacity sensor type as well as an optical type.

The change of the projection magnification of the projection optical system 7 due to the change of the output wavelength of the light source, calculated by the wavelength control means 10 is fed to magnification correcting means 73. In the embodiment of FIG. 4, the projection magnification of the projection optical system 7 is corrected by moving a lens 71 adjacent to the reticle 6 in the projection optical system 7 along the optical axis. The magnification correcting means 73 drives a magnification adjusting lens 71 by lens driving means 72 in accordance with the change of the projection magnification.

As for a method of adjusting the projection magnification of the projection optical system 7, the lens 71 adjacent the reticle 6 is moved. In another method, the refraction index of the gas may be controlled by changing the pressure between predetermined lenses. When the object side of the projection optical system 7 is not telecentric, the reticle 6 may be moved in the direction of the optical axis.

In FIG. 4, the focus position or the magnification change is calculated by the wavelength control means 10. In another example, a reference pattern is provided on the wafer stage 24, and a position of an image of a reference pattern projected back onto the reticle 6 through the projection optical system 7 is detected to directly determine the best focus position or the projection magnification of the projection optical system 7. In this way, further accurate focus position and the magnification are detected.

In this embodiment, the focus position and the projection magnification are corrected. However, only the focus position or only the projection magnification may be corrected as desired.

In this embodiment, the spherical aberration can be set to be a desired level, and in addition, the focus position change and the magnification change of the projection optical system due to the wavelength change of the light can be corrected so that defocused transfer of the reticle pattern onto the wafer can be prevented and that the misalignment between the pattern of the second object and the pattern of the first object can be avoided.

In order to set the desired spherical aberration by the spherical aberration input means 11, it may be inputted directly on a keyboard 12. In another example, a bar code indicative of a parameter relating to the exposure to the reticle 6 may be provided, and the condition of the spherical aberration can be set therein. By doing so, when the reticle 6 is loaded into the exposure apparatus, the spherical aberration information can be detected from the bar code of the reticle 6, by an unshown bar code reader.

The present invention is applicable to a stepper in which the exposure is effected while stepping the wafer 8, or a step-and-scan system in which the sequential exposures are carried out while scanning with synchronization between the reticle 6 and the wafer 8.

According to the foregoing embodiment, the spherical aberration of the projection optical system can be changed easily, and therefore, the exposure can be carried out under the condition to minimize a change of the line width due to the defocusing, for various resist materials.

Figure 5:
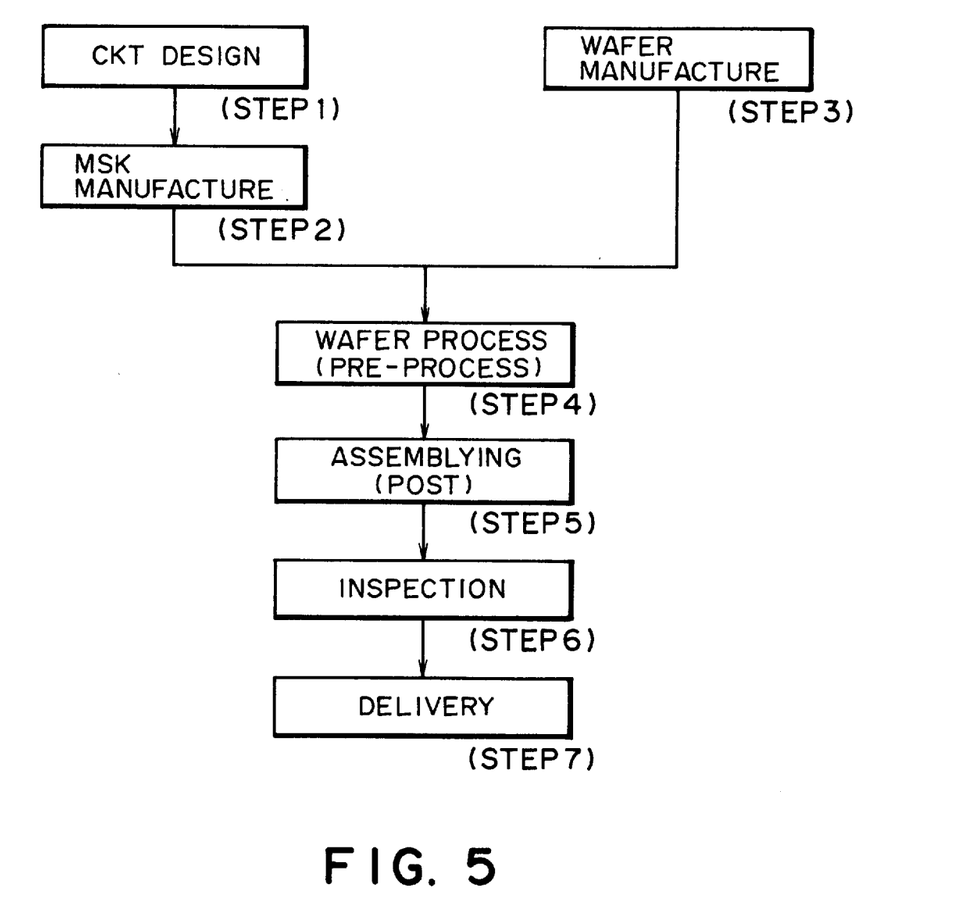
FIG. 5 is a flow chart of manufacturing of a semiconductor device.

The description will be made as to an embodiment of a device manufacturing method using the scanning exposure apparatus. FIG. 5 is a flow chart of manufacturing semiconductor devices such as IC, LSI or the like, or devices such as a liquid crystal panel or a CCD or the like. At step 1, (circuit design), the circuits of the semiconductor device are designed. At step 2 (mask manufacturing), the mask (reticle 304) having the designed circuit pattern is manufactured. On the other hand, at step 3, a wafer (306) is manufactured using the proper material such as silicon. Step 4 (wafer processing) is called a pre-step, in which an actual circuit pattern is formed on a wafer through a lithographic technique using the prepared mask and wafer. At step 5 (post-step), a semiconductor chip is manufactured from the wafer subjected to the operations of step 4. Step 5 includes assembling steps (dicing, bonding), a packaging step (chip sealing) or the like. At step 6 (inspection), the operation of the semiconductor device manufactured by the step 5 is inspected, and a durability test thereof is carried out. In this manner, the semiconductor device is manufactured and delivered at step 7.

Figure 6:
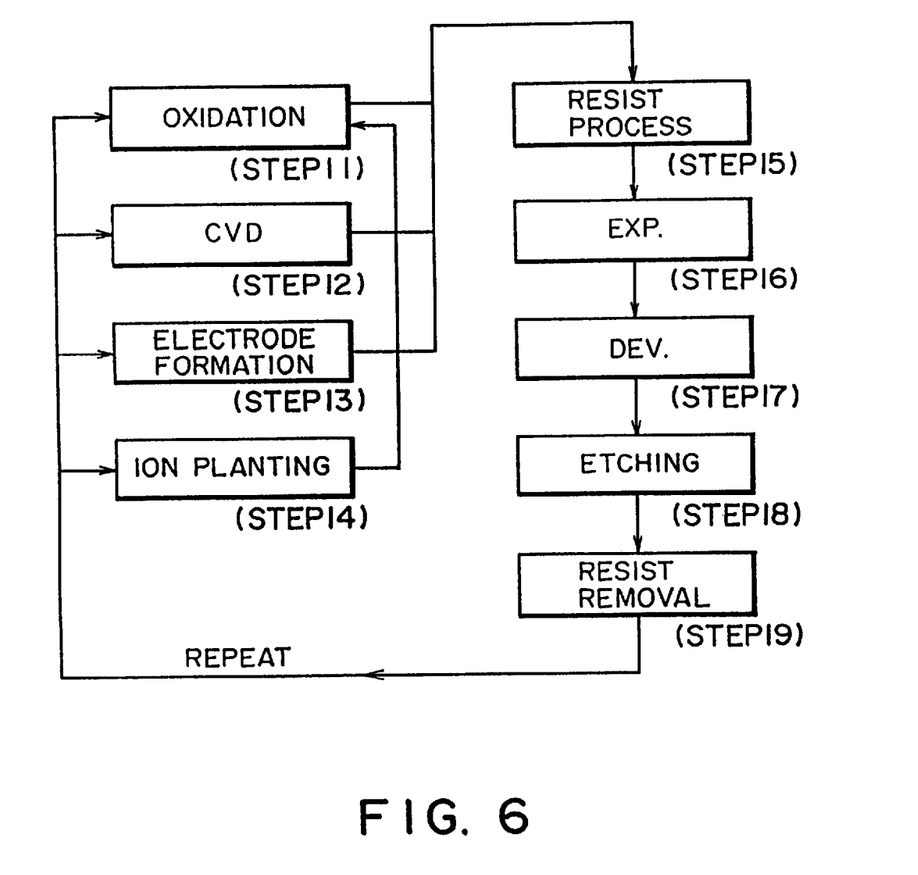
FIG. 6 is a flow chart of wafer processing in FIG. 5.

FIG. 6 is a flow chart of detailed wafer processing. At step 11 (oxidation), the surface of the wafer is oxidized. At step 12 (CVD), an insulating film is formed on a surface of the wafer. At step 13 (electrode formation), an electrode is formed on the wafer by evaporation. At step 14 (ion injection), the ion is implemented into the wafer. At step 15 (resist processing), a photosensitive material is applied on the wafer. At step 16 (exposure), the circuit pattern of the mask (reticle 304) is projected onto the wafer by the above-described exposure apparatus. At step 17 (development), the exposed wafer is developed. At step 18 (etching), the portions outside the resist image are removed. At step 19 (resist removal), the resist is removed after the etching. By repeating the above-described steps, overlaid circuit patterns are formed on the wafer.

According to the manufacturing method of this embodiment, a high integrating density semiconductor device or the like can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus comprising:

illuminating means for illuminating a first object with exposure light:

a projection optical system for projecting a pattern of the first object onto a second object with the exposure light;

wavelength changing means for changing a wavelength of the exposure light to change a spherical aberration of said projection optical system; and correcting means for correcting a change, due to the change in the wavelength, in an optical property other than the spherical aberration.

2. An apparatus according to claim 1, wherein said illuminating means comprises a band-narrowed laser for emitting a band-narrowed laser beam.

3. An apparatus according to claim 2, wherein said laser is capable of changing an oscillation wavelength, and said wavelength changing means comprises means for changing the wavelength of the laser.

4. An apparatus according to claim 1, wherein said correcting means corrects at least one of a focus position and a magnification of said projection optical system.

5. An apparatus according to claim 1, wherein said correcting means corrects a focus position of said projection optical system.

6. An apparatus according to claim 1, wherein said correcting means corrects a magnification of said projection optical system.

7. A device manufacturing method comprising a step of transferring the pattern of the first object onto the second object, using the projection exposure apparatus as defined in any one of claims 1 through 3, 4 and 5.

8. A projection exposure method comprising the steps of:

projecting a pattern of a first object onto a second object through a projection optical system using projection light;

changing a spherical aberration of the projection optical system by changing a wavelength of the projection light; and correcting a change of optical performance, other than the spherical aberration, resulting from the change of the wavelength.

9. A method according to claim 8, wherein the optical performance includes at least one of a focus position and a magnification of the projection optical system.

10. A method according to claim 8, wherein the optical performance includes a focus position of the projection optical system.

11. A method according to claim 8, wherein the optical performance includes a magnification of the projection optical system.

12. A method according to any one of claims 8–9, wherein the pattern of the first object is a device pattern.

13. A projection exposure apparatus comprising:

a laser comprising a resonance oscillator and a wavelength selecting element, in said resonance oscillator, for narrowing a band width of a laser beam, said wavelength selecting element being rotatable to change the wavelength of the laser beam;

an illumination optical system for illuminating a mask with the laser beam, said illumination optical system comprising a beam splitter for extracting a portion of the laser beam, a fly eye lens, a first optical system for directing the laser beam to said fly eye lens and a second optical system for directing beams from said fly eye lens to the mask;

a projection optical system for projecting a pattern of the mask onto a wafer, said projection optical system comprising a plurality of lenses;

magnification changing means for changing a projection magnification of the mask pattern by said projection optical system;

distance changing means for changing a distance between an imaging plane of the mask pattern by said projection optical system and a surface of the wafer;

a wavelength detector for receiving a beam from said beam splitter and for detecting a wavelength thereof;

setting means for setting a spherical aberration of said projection optical system; and control means, responsive to said setting means, for determining a wavelength of the laser beam providing the spherical aberration set by said setting means, and for changing the wavelength of the laser beam by rotating said wavelength selecting element while checking an output of said wavelength detector, so as to adjust the laser beam to have the determined wavelength, wherein said control means controls at least one of said magnification changing means and said distance changing means to correct an error in the projection magnification of said projection optical system resulting from at least one of the change of the wavelength of the laser beam and an error in the position of the imaging plane of said projection optical system.

14. An apparatus according to claim 13, wherein said laser generates an excimer laser beam.

15. An apparatus according to claim 13, wherein said projection optical system comprises a mirror.

\* \* \* \* \*

UNITED STATES PATENT AND TRADEMARK OFFICE
CERTIFICATE OF CORRECTION

PATENT NO. : 5,831,715

DATED : November 3, 1998

INVENTORS : KAZUHIRO TAKAHASHI

It is certified that error appears in the above-identified patent and that said Letters Patent is hereby corrected as shown below:

<u>COLUMN 1</u>:

```
line 24, "of the" should read --the--; and
line 32, "the ideal" should read --ideal--.
```

Signed and Sealed this

First Day of June, 1999

*Attest:*

Q. TODD DICKINSON

*Attesting Officer*     *Acting Commissioner of Patents and Trademarks*